United States Patent
Takizawa et al.

(10) Patent No.: US 7,969,768 B2
(45) Date of Patent: Jun. 28, 2011

(54) MAGNETIC RANDOM ACCESS MEMORY

(75) Inventors: Ryousuke Takizawa, Naka-gun (JP); Kenji Tsuchida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/627,616

(22) Filed: Nov. 30, 2009

(65) Prior Publication Data
US 2010/0072530 A1 Mar. 25, 2010

Related U.S. Application Data

(63) Continuation of application No. PCT/JP2008/056387, filed on Mar. 31, 2008.

(51) Int. Cl.
*G11C 11/00* (2006.01)

(52) U.S. Cl. ............ 365/158; 365/55; 365/50; 365/148; 365/171; 365/189.14; 365/189.16; 257/295; 257/421; 257/E27.006

(58) Field of Classification Search .................... 365/55, 365/50, 148, 158, 171, 189.14, 189.16; 257/295, 257/421, E27.006
See application file for complete search history.

(56) References Cited

U.S. PATENT DOCUMENTS

| | | | |
|---|---|---|---|
| 5,695,864 A | 12/1997 | Slonczewski | |
| 7,577,021 B2 * | 8/2009 | Guo et al. | 365/158 |
| 2007/0159875 A1 * | 7/2007 | Shimomura et al. | 365/158 |
| 2007/0285974 A1 * | 12/2007 | Takemura et al. | 365/158 |
| 2008/0024935 A1 * | 1/2008 | Tagami et al. | 360/313 |

FOREIGN PATENT DOCUMENTS

JP 2008-10511 1/2008

OTHER PUBLICATIONS

English translation of International Preliminary Report on Patentability with Written Opinion issued Dec. 23, 2010, in International Patent Application No. PCT/JP2008/056387 (International filing date Mar. 31, 2008).

* cited by examiner

*Primary Examiner* — Huan Hoang
*Assistant Examiner* — Fernando N Hidalgo
(74) *Attorney, Agent, or Firm* — Oblon, Spivak, McClelland, Maier & Neustadt, L.L.P.

(57) ABSTRACT

A magnetic random access memory of an aspect of the present invention including a magnetoresistive effect element having a fixed layer whose magnetization direction is fixed, a recording layer whose magnetization direction is reversible, and a non-magnetic layer provided between the fixed and recording layers, wherein the magnetization directions of the fixed and recording layers are in a parallel state or in an anti-parallel state depending on a direction of a current flowing between the fixed and recording layers, a first transistor having a gate and a first current path having one end connected to the fixed layer, a second transistor having a gate and a second current path having one end connected to the recording layer, a first bit line to which other end of the first current path is connected, and a second bit line to which other end of the second current path is connected.

13 Claims, 20 Drawing Sheets

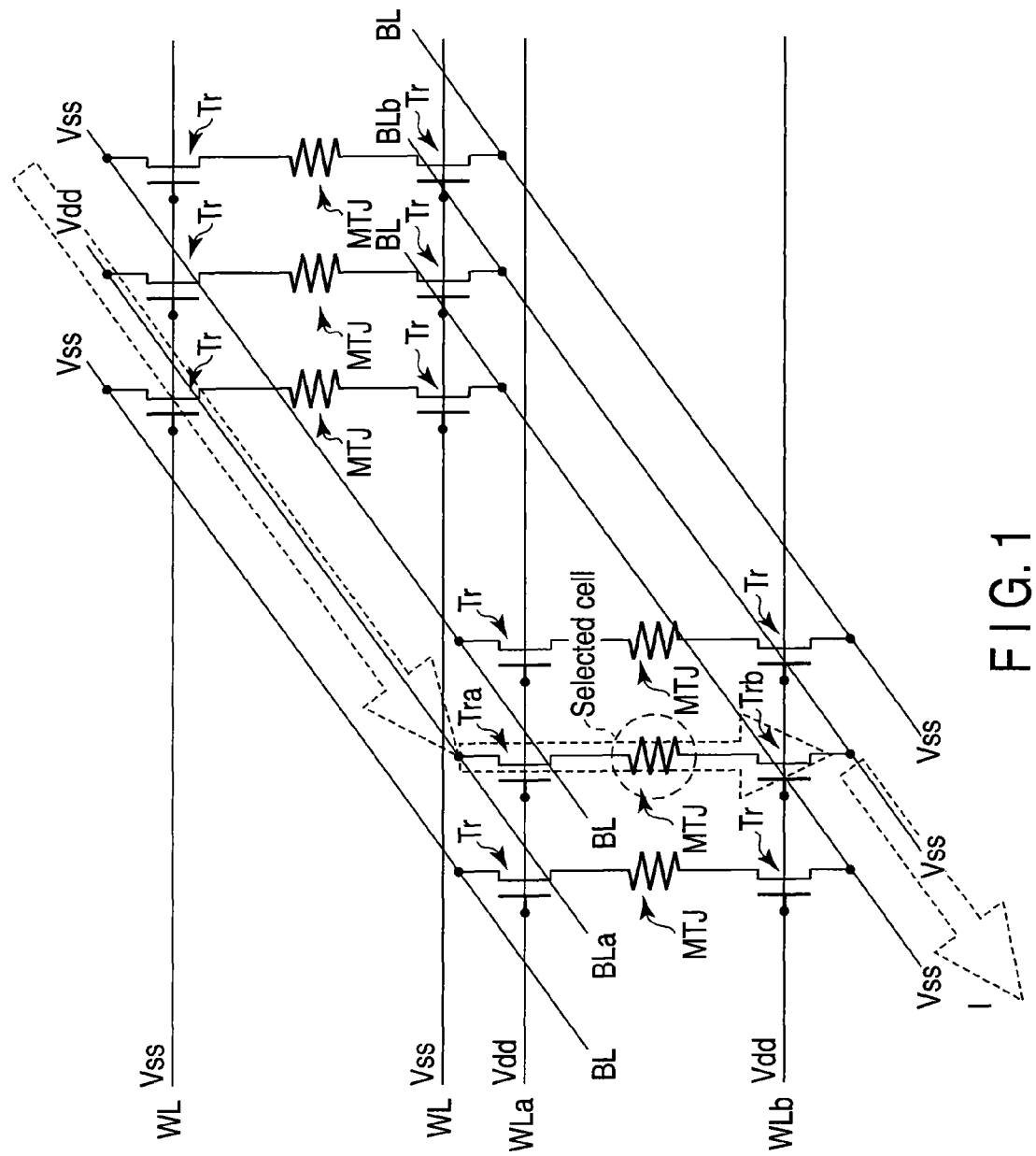
F I G. 1

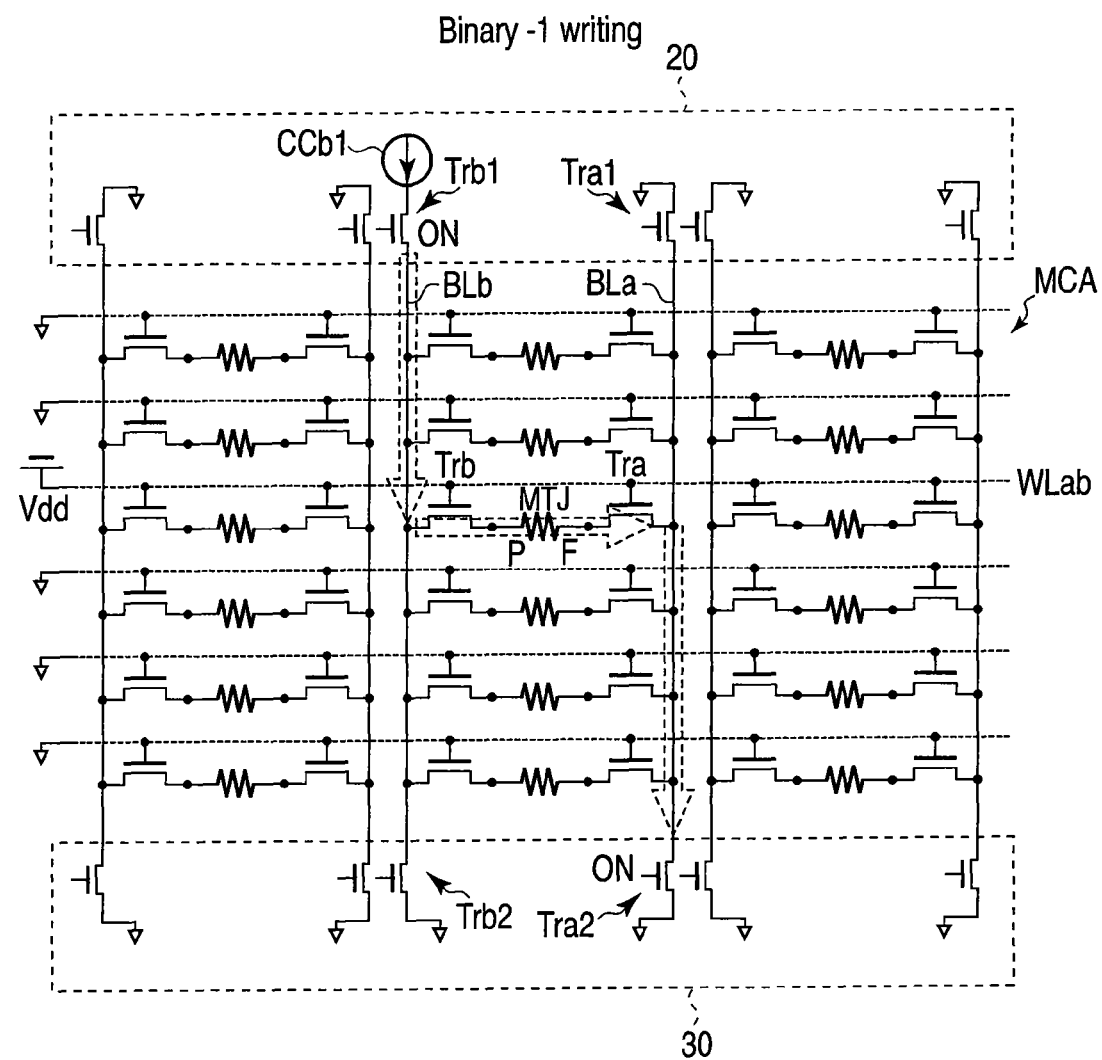
F I G. 4

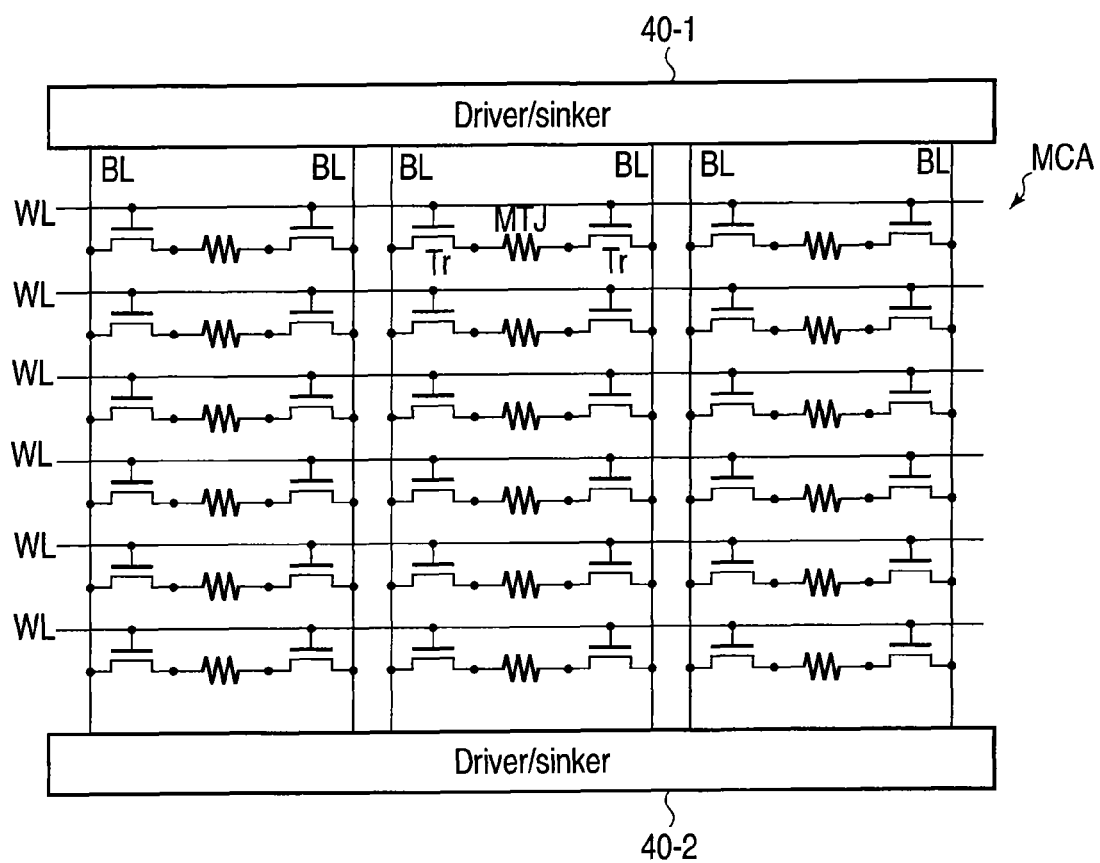
F I G. 9

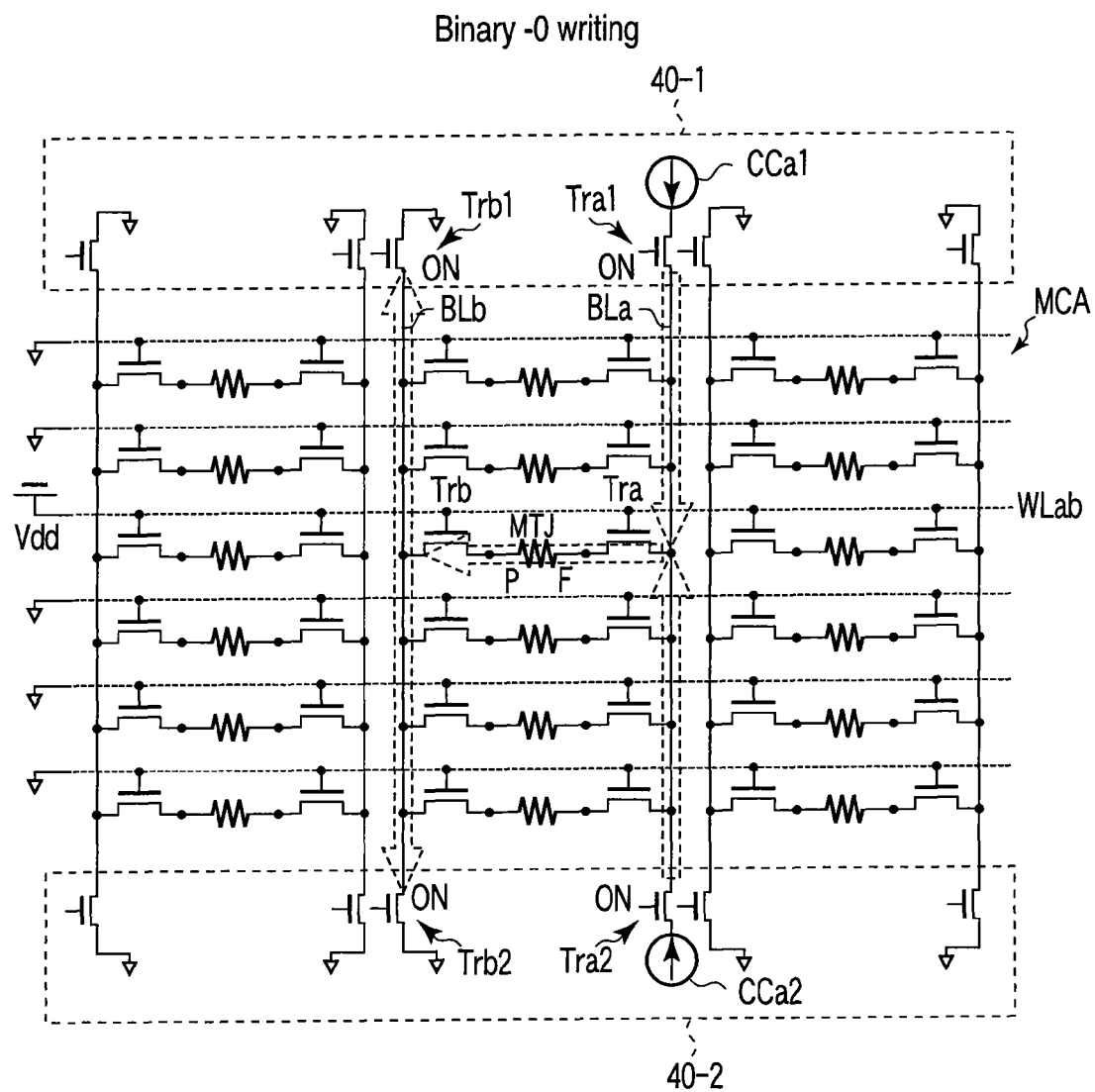
F I G. 11

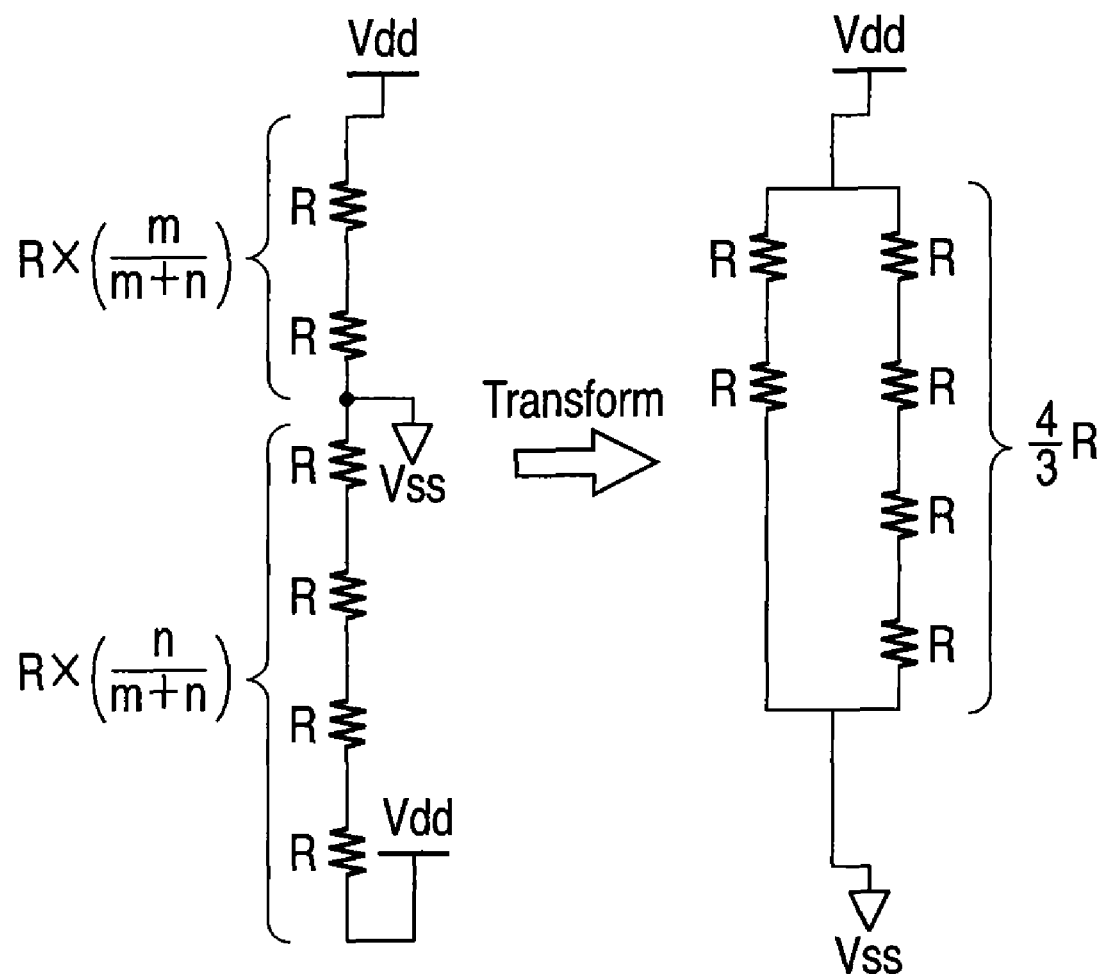
F I G. 12

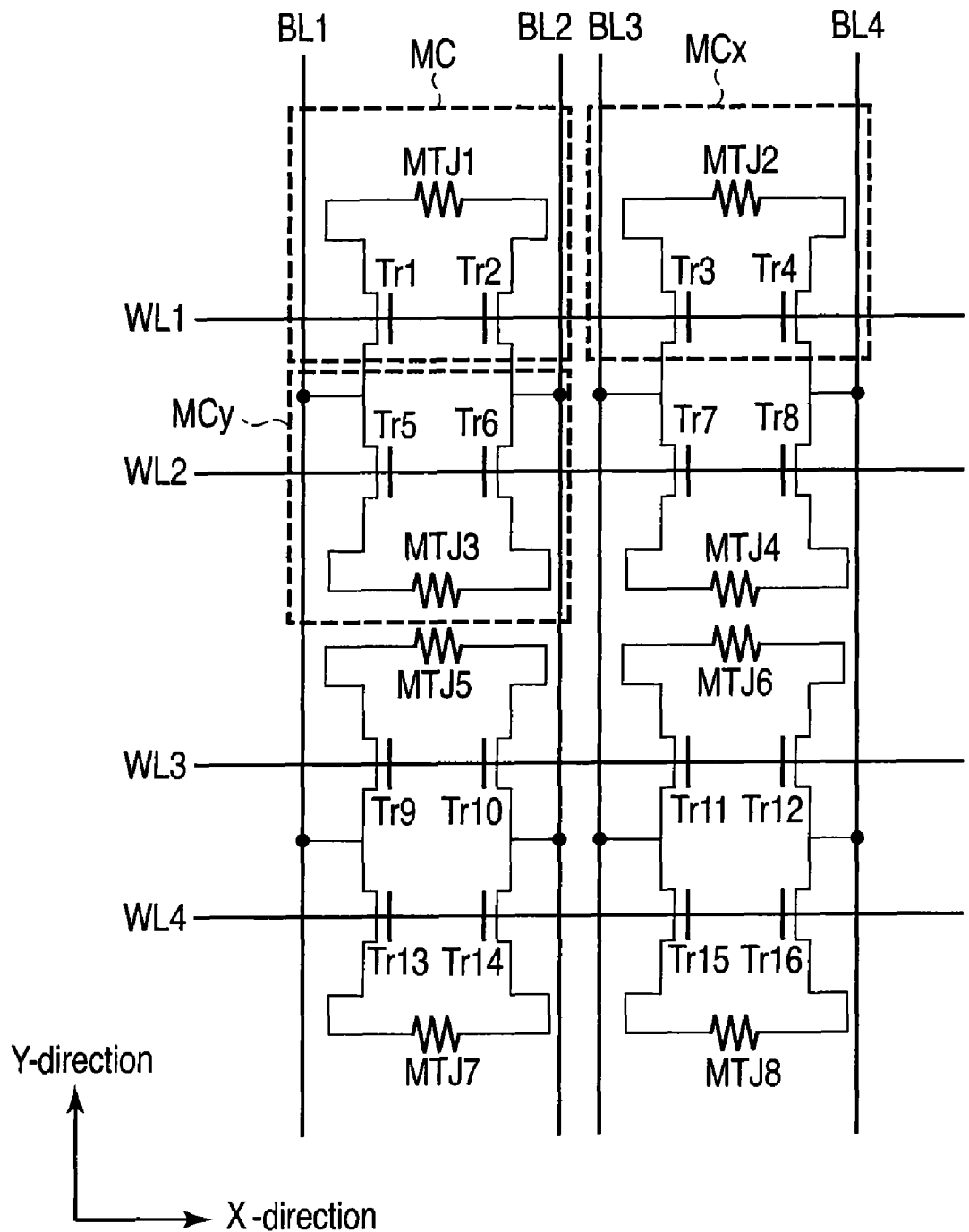
F I G. 13

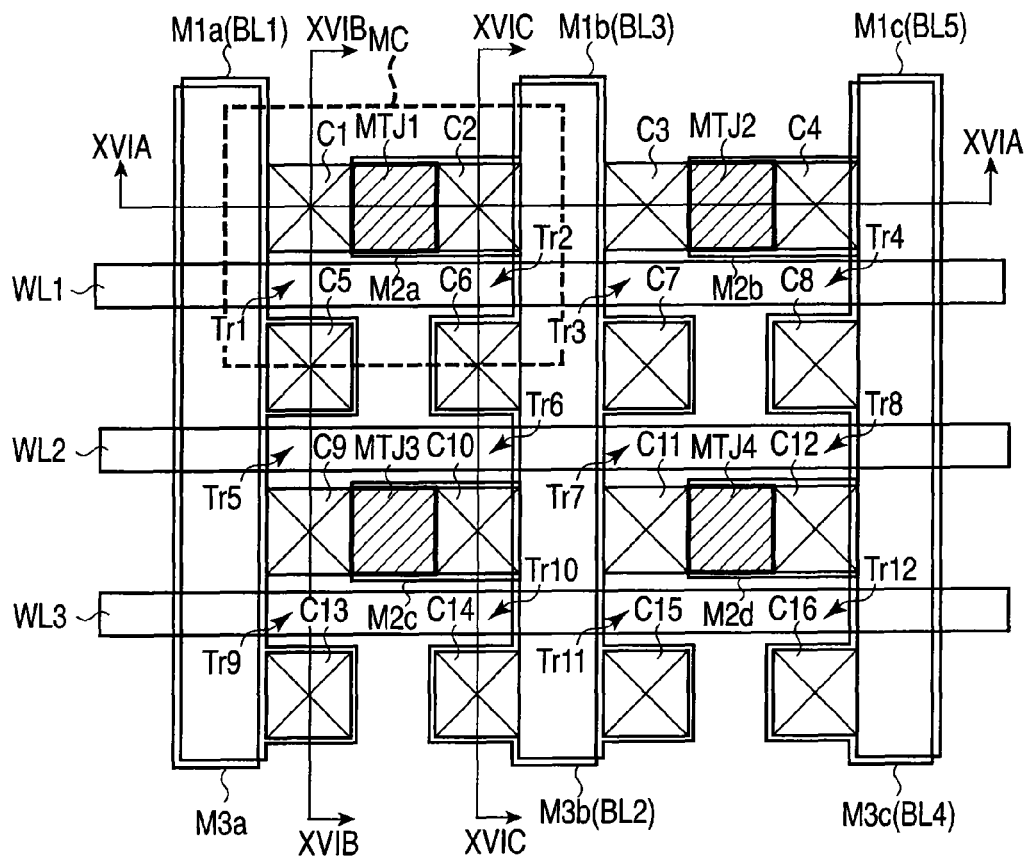
F I G. 14
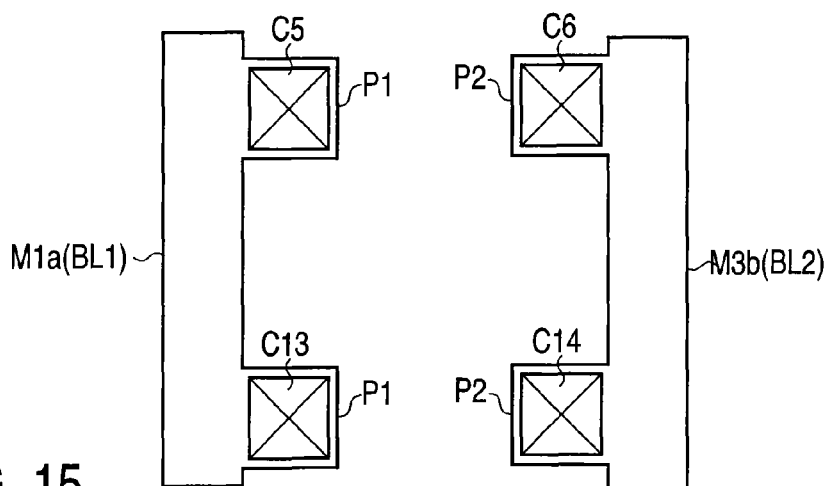
F I G. 15

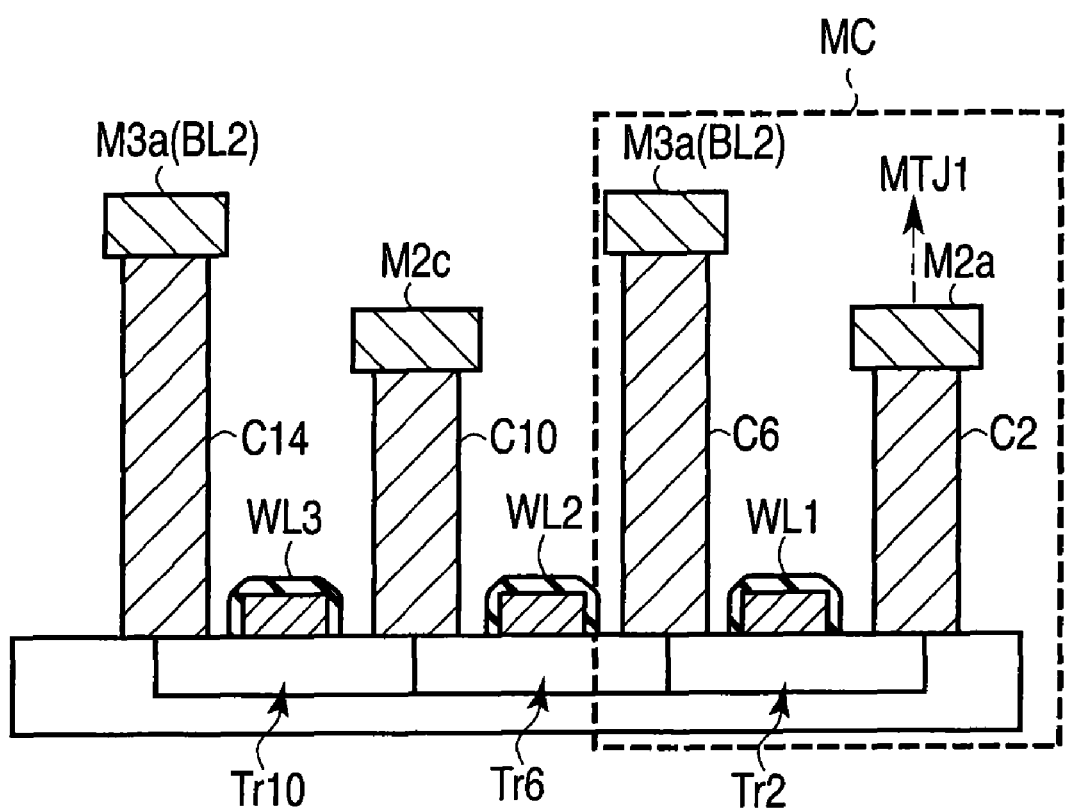
F I G. 16C

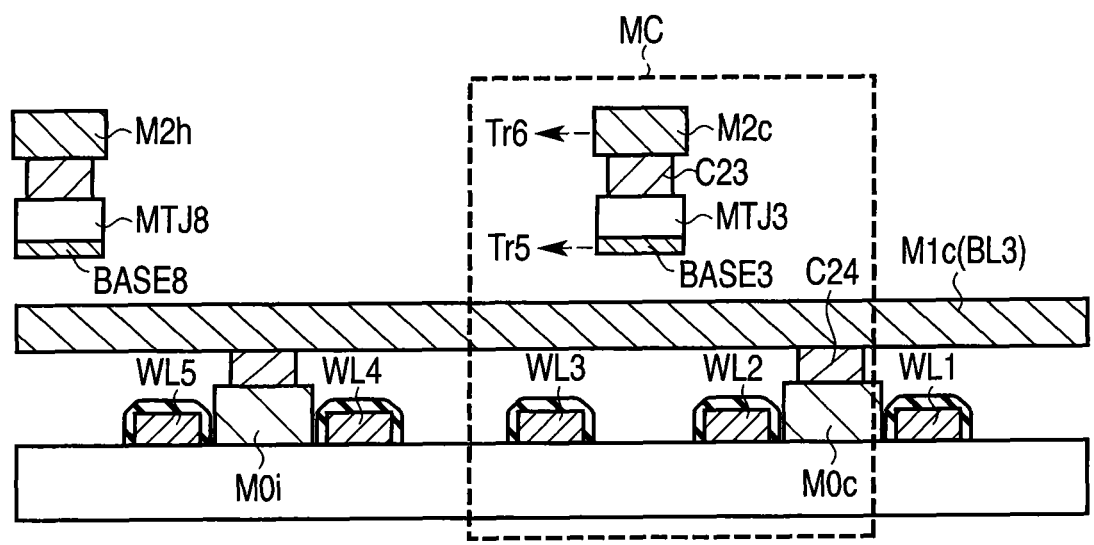
F I G. 19C

MAGNETIC RANDOM ACCESS MEMORY

CROSS REFERENCE TO RELATED APPLICATIONS

This is a Continuation Application of PCT Application No. PCT/JP2008/056387, filed Mar. 31, 2008, which was published under PCT Article 21(2) in Japanese.

BACKGROUND OF THE INVENTION

1. Field of the Invention

The present invention relates to a magnetic random access memory (MRAM) of a spin-transfer magnetization reversal type.

2. Description of the Related Art

A magnetic random access memory is a device which stores binary 1 or 0 utilizing the magnetoresistive effect to cause memory operation. This memory is evaluated as one of universal memory device candidates having a nonvolatile property, high integration, high reliability, low power consumption and high-speed operation.

Recently, regarding a magnetic random access memory, a writing method using a spin-transfer magnetization reversal technique is proposed by Slonczewski (see U.S. Pat. No. 5,695,864). In the spin-transfer magnetization reversal technique, there is a spin-polarized electron having two electron spin directions which contributes to magnetization of a recording layer depending on the direction of current. The spin-polarized electron acts on the magnetization of the recording layer to reverse the magnetization of the recording layer.

In such a spin-transfer magnetization reversal, since the amount of current required for writing is proportional to the volume of a magnetic tunnel junction (MTJ) element, the amount of the current required for writing decreases as the size of the element decreases. On the other hand, as the volume of the MTJ element decreases, the resistance to a magnetization reversal due to thermal agitation decreases. Accordingly, in a 1T1R (one transistor [T] and one magnetoresistive element [R])-type magnetic random access memory of a conventional example, it is considered that advancement in micro-fabrication would increase the possibility of a soft error (erroneous writing or the like) in a non-selected cell by charging and discharging in read and write operation.

BRIEF SUMMARY OF THE INVENTION

A magnetic random access memory of an aspect of the present invention comprising: a first magnetoresistive effect element having a first fixed layer whose magnetization direction is fixed, a first recording layer whose magnetization direction is reversible, and a first non-magnetic layer provided between the first fixed layer and the first recording layer, wherein the magnetization directions of the first fixed layer and the first recording layer are in a parallel state or in an anti-parallel state depending on a direction of a current flowing between the first fixed layer and the first recording layer; a first transistor having a first gate and a first current path, the first current path having one end connected to the first fixed layer; a second transistor having a second gate and a second current path, the second current path having one end connected to the first recording layer; a first bit line to which other end of the first current path is connected; and a second bit line to which other end of the second current path is connected.

BRIEF DESCRIPTION OF THE SEVERAL VIEWS OF THE DRAWING

FIG. 1 is a schematic circuit diagram of a memory cell array of a magnetic random access memory according to one embodiment of the invention.

FIG. 4 is a view for illustrating a binary-1 write operation in Example 1 of FIG. 3.

FIG. 9 is a schematic diagram for implementing Example 3 of the write operation of the magnetic random access memory according to one embodiment of the invention.

FIG. 11 is a view for illustrating a binary-0 write operation in Example 3 of FIG. 9.

FIG. 12 is a view for explaining the resistance of a current path in Example 3 of FIG. 9.

FIG. 13 is a schematic circuit diagram of Example 1 of the magnetic random access memory according to one embodiment of the invention.

FIG. 14 schematically shows the layout of Example 1 of a memory cell array of the magnetic random access memory according to one embodiment of the invention.

FIG. 15 shows a partial layout of FIG. 14.

FIG. 16C is a cross-sectional view taken along line XVIC-XVIC of FIG. 14.

FIG. 19C is a cross-sectional view taken along line XIXC-XIXC of FIG. 18.

DETAILED DESCRIPTION OF THE INVENTION

Figure 2A:
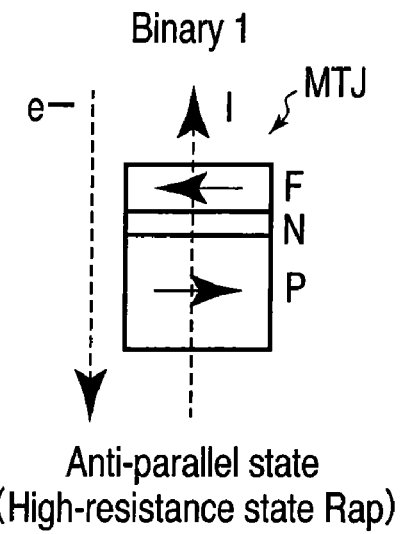
FIG. 2A schematically shows an MTJ element using a spin-transfer magnetization reversal technique according to one embodiment of the invention.

An embodiment of the invention will be described below with reference to the accompanying drawings. In this description, the common parts are denoted by the common reference characters throughout all the drawings.

[1] Memory Cell

FIG. 1 shows a schematic circuit diagram of a memory cell array of a magnetic random access memory (MRAM) according to one embodiment of the invention. In the following, the memory cell of the magnetic random access memory according to one embodiment of the invention will be described.

The memory cell of the magnetic random access memory according to one embodiment of the invention is in a 2T1R structure composed of two transistors (T) and one magnetoresistive element (R).

Specifically, as shown in FIG. 1, one ends of current paths of transistors Tra and Trb made, for example, of metal-oxide-semiconductor field-effect transistors (MOSFETs) are connected to both ends of a magnetic tunnel junction (MTJ) element. A bit line BLa is connected to the other end of the current path of transistor Tra, and a bit line BLb to the other end of the current path of transistor Trb. Word lines WLa and WLb are connected to the gates of transistors Tra and Trb, respectively.

[2] MTJ Element

Figure 2B:
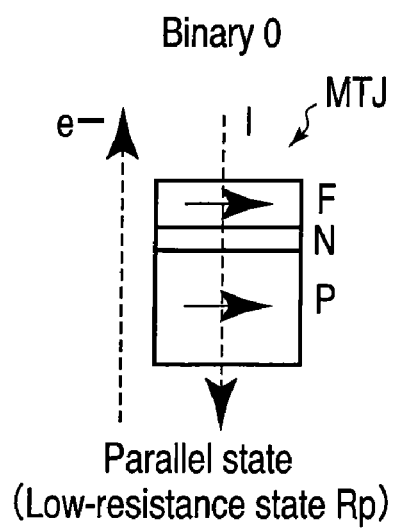
FIG. 2B schematically shows the MTJ element using the spin-transfer magnetization reversal technique according to one embodiment of the invention.

FIGS. 2A and 2B schematically show an MTJ element using a spin-transfer magnetization reversal technique according to one embodiment of the invention. Hereinbelow, the MTJ element according to one embodiment of the invention will be described.

As shown in FIGS. 2A and 2B, MTJ element MTJ comprises a fixed layer (pinned layer) P whose magnetization direction is fixed, a recording layer (free layer) F whose magnetization direction is reversible, and a non-magnetic layer N provided between the fixed layer P and the recording layer F. Depending on the direction of a current I flowing between the fixed layer P and the recording layer F, the magnetization directions of the fixed layer P and the recording layer F are in a parallel state or in an anti-parallel state.

Note that while the magnetization direction of MTJ element MTJ is horizontal with respect to the film surface in these drawings, this direction may be vertical with respect to the film surface.

MTJ element MTJ may be in a single junction structure having one non-magnetic layer N as shown, and may also be in a double junction structure having two non-magnetic layers N. MTJ element MTJ of the double junction structure comprises a first fixed layer, a second fixed layer, a recording layer provided between the first and second fixed layers, a first non-magnetic layer provided between the first fixed layer and the recording layer, and a second non-magnetic layer provided between the second fixed layer and the recording layer.

The planar shape of MTJ element MTJ can be changed to various shapes such as a rectangular shape, a square shape, an elliptical shape, a circular shape, a hexagonal shape, a rhombic shape, a parallelogram shape, a cross shape and a bean-like shape (concave shape).

[3] Spin-Transfer Writing

In the magnetic random access memory according to one embodiment of the invention, data writing using a spin-transfer technique is performed.

When binary 1 is written, as shown in FIG. 2A, a current I is passed in the direction from the fixed layer P to the recording layer F of MTJ element MTJ. That is, electrons e are injected from the recording layer F side to the fixed layer P side. This causes the magnetizations of the fixed layer P and the recording layer F to be in opposite directions, resulting in an anti-parallel state. Such a high-resistance state Rap is defined as binary 1.

In contrast, when binary 0 is written, as shown in FIG. 2B, the current I is passed in the direction from the recording layer F to the fixed layer P of MTJ element MTJ. That is, electrons e are injected from the fixed layer P side to the recording layer F side. This causes the magnetizations of the fixed layer P and the recording layer F to be in the same direction, resulting in a parallel state. Such a low-resistance state Rp is defined as binary 0.

In the case where such spin transfer writing is performed in a selected cell of FIG. 1, for example, the writing is as follows. Bit line BLa is set to a power supply potential Vdd, and bit lines BL other than bit line BLa are set to a ground potential Vss. Word lines WLa and WLb are set to the power supply potential Vdd, and word lines WL other than word lines WLa and WLb are set to the ground potential Vss. Thus, both transistors Tra and Trb connected to MTJ element MTJ of the selected cell are turned on. As a result, the write current I flows from bit line BLa through MTJ element MTJ to bit line BLb. Depending on the direction in which the write current I flows, the magnetization directions of the fixed layer and the recording layer of MTJ element MTJ are in a parallel or anti-parallel state.

Here, regarding bit lines BLa and BLb to which the selected cell is connected, a plurality of cells other than the selected cell are also connected to these bit lines BLa and BLb. However, with a 2T1R-type structure as shown in FIG. 1, a cell connected to the same bit lines BLa and BLb as the selected cell is in an electrically cut-off state because transistors Tr on both ends of the memory cell are not selected. Therefore, no non-selected cell is affected by charging and discharging due to the read or write operation of the selected cell.

[4] Write Operation

[4-1] Example 1

Figure 3:
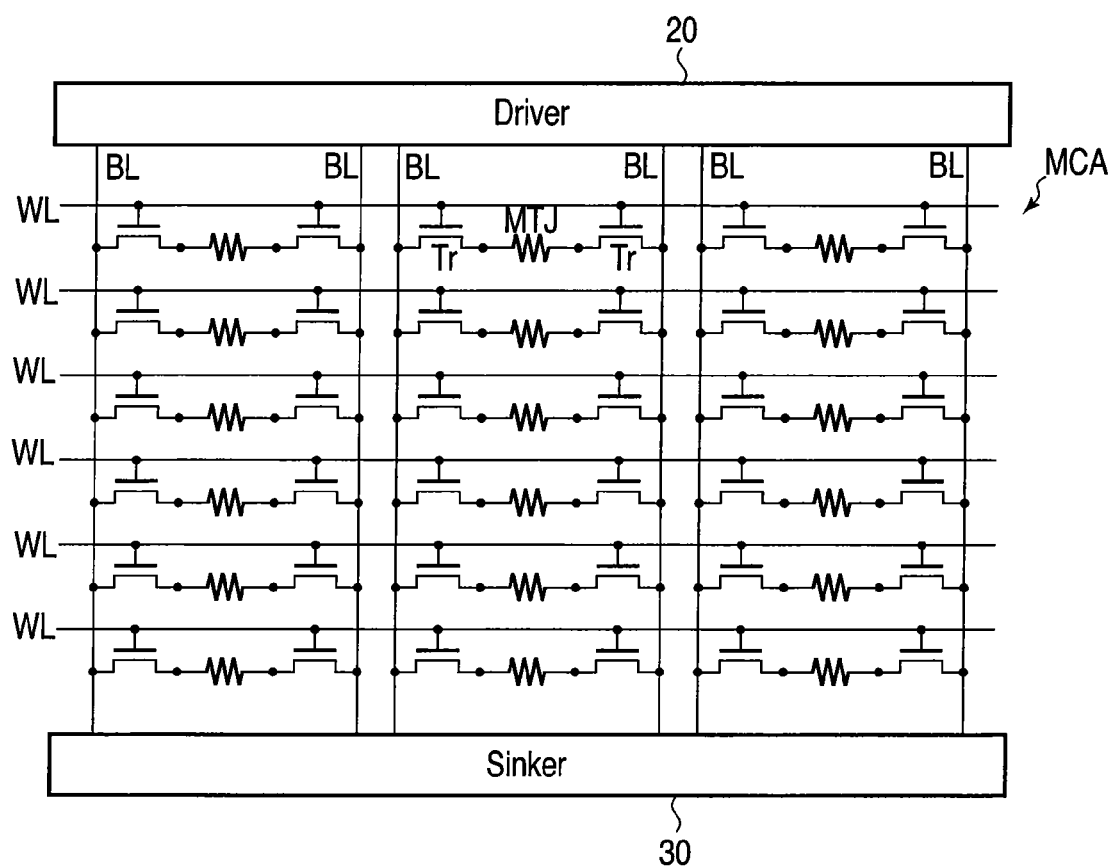
FIG. 3 is a schematic diagram for implementing Example 1 of write operation of the magnetic random access memory according to one embodiment of the invention.
Figure 5:
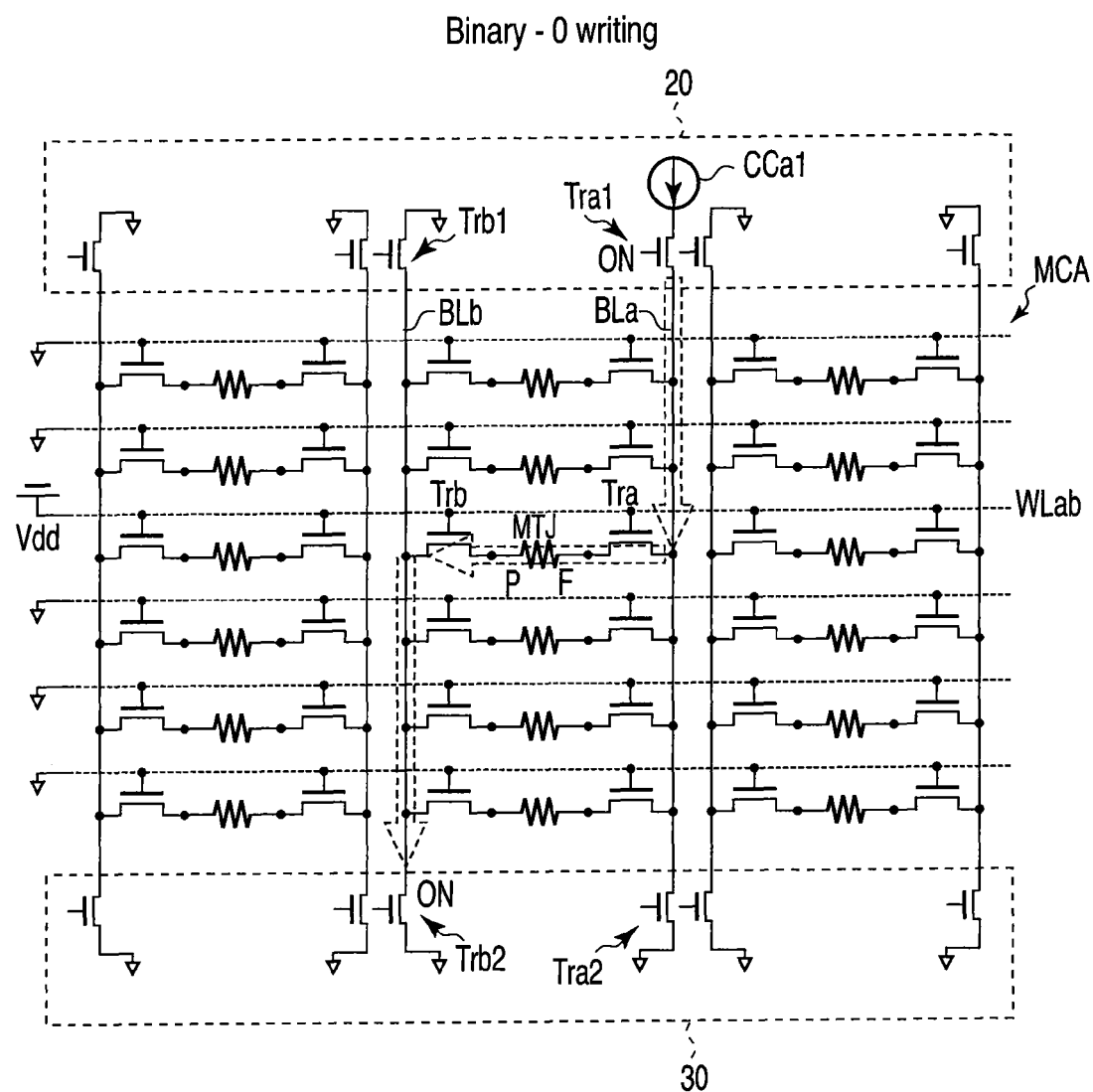
FIG. 5 is a view for illustrating a binary-0 write operation in Example 1 of FIG. 3.

FIG. 3 is a schematic diagram for implementing Example 1 of write operation of the magnetic random access memory according to one embodiment of the invention. FIGS. 4 and 5 are views for illustrating a binary-1 and binary-0 write operation in Example 1 of FIG. 3. Hereinbelow, Example 1 of the write operation will be described.

As shown in FIG. 3, in Example 1 of the write operation, a driver 20 is arranged only on the side of a first end portion of a memory cell array MCA, and a sinker 30 is arranged only on the side of a second end portion of the memory cell array MCA. Accordingly, one ends of bit lines BL are connected to the driver 20 alone, and the other ends of bit lines BL are connected to the sinker 30 alone.

With such a configuration of peripheral circuits, in Example 1 of the write operation, the write current I is configured to only flow from the first end portion (upper side of the drawing) to the second end portion (lower side of the drawing) of the memory cell array MCA.

When binary-1 writing is performed, as shown in FIG. 4, transistors (transfer gate transistors) Trb1 and Tra2, which are connected to bit lines BLa and BLb connected to the selected cell, are turned on, and transistors (transfer gate transistors) Tra1 and Trb2 are turned off. Further, a word line WLab is set to the power supply potential Vdd to turn on transistors Tra and Trb connected to both ends of MTJ element MTJ of the selected cell. Thus, the write current I is passed from a constant current source CCb1 to the selected cell. This write current I flows from the driver 20, bit line BLb and the fixed layer P of MTJ element MTJ to the recording layer F of MTJ element MTJ, bit line BLa and the sinker 30. That is, the write current I flows from the first end portion (upper side of the drawing) to the second end portion (lower side of the drawing) of the memory cell array MCA.

When binary-0 writing is performed, as shown in FIG. 5, transistors Tra1 and Trb2, which are connected to bit lines BLa and BLb connected to the selected cell, are turned on, and transistors Trb1 and Tra2 are turned off. Further, word line WLab is set to the power supply potential Vdd to turn on transistors Tra and Trb connected to both ends of MTJ element MTJ of the selected cell. Thus, the write current I is passed from a constant current source CCa1 to the selected cell. This write current I flows from the driver 20, bit line BLa and the recording layer F of MTJ element MTJ to the fixed layer P of MTJ element MTJ, bit line BLb and the sinker 30. That is, the write current I flows from the first end portion (upper side of the drawing) to the second end portion (lower side of the drawing) of the memory cell array MCA.

As described above, in Example 1, the driver 20 and the sinker 30 of a write circuit are arranged in opposite end portions of the memory cell array MCA. Accordingly, the write current I flows from the first end portion (upper side of the drawing) to the second end portion (lower side of the drawing) of the memory cell array MCA, and therefore the length of the current path through which the write current I flows is the same even if any cell of the memory cell array MCA is selected. This enables the resistance of the current path through which the write current I flows to be approximately equal regardless of the position of the selected cell.

[4-2] Example 2

Figure 6:
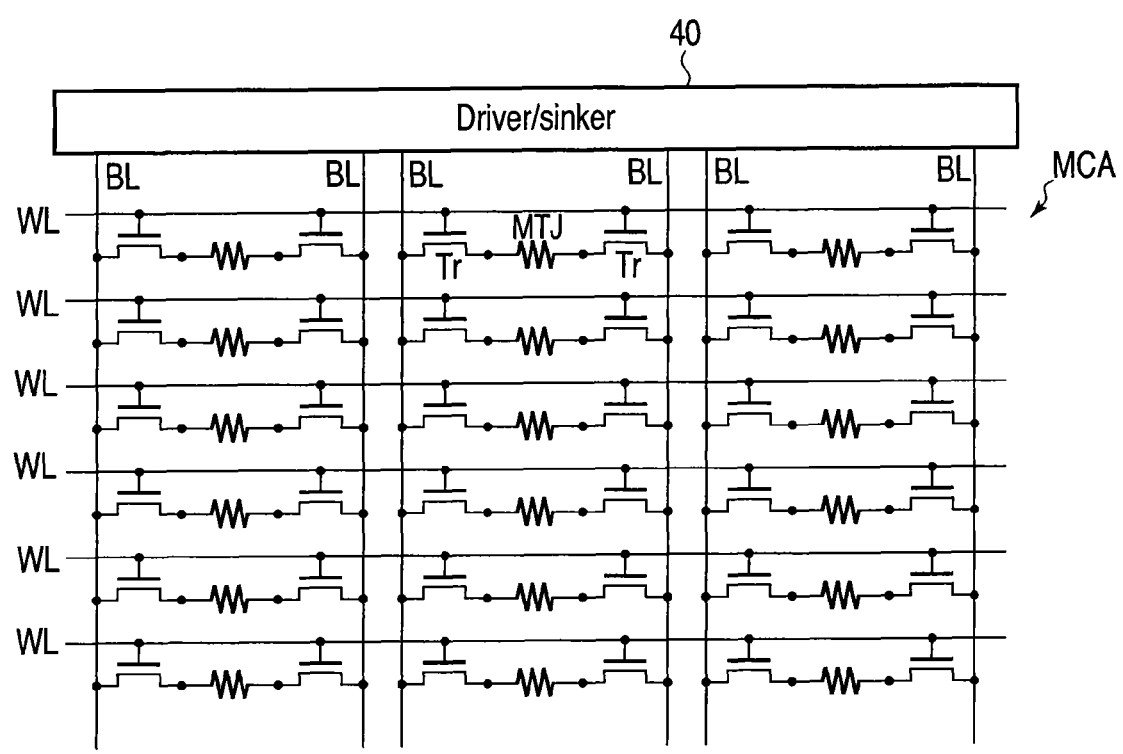
FIG. 6 is a schematic diagram for implementing Example 2 of the write operation of the magnetic random access memory according to one embodiment of the invention.
Figure 7:
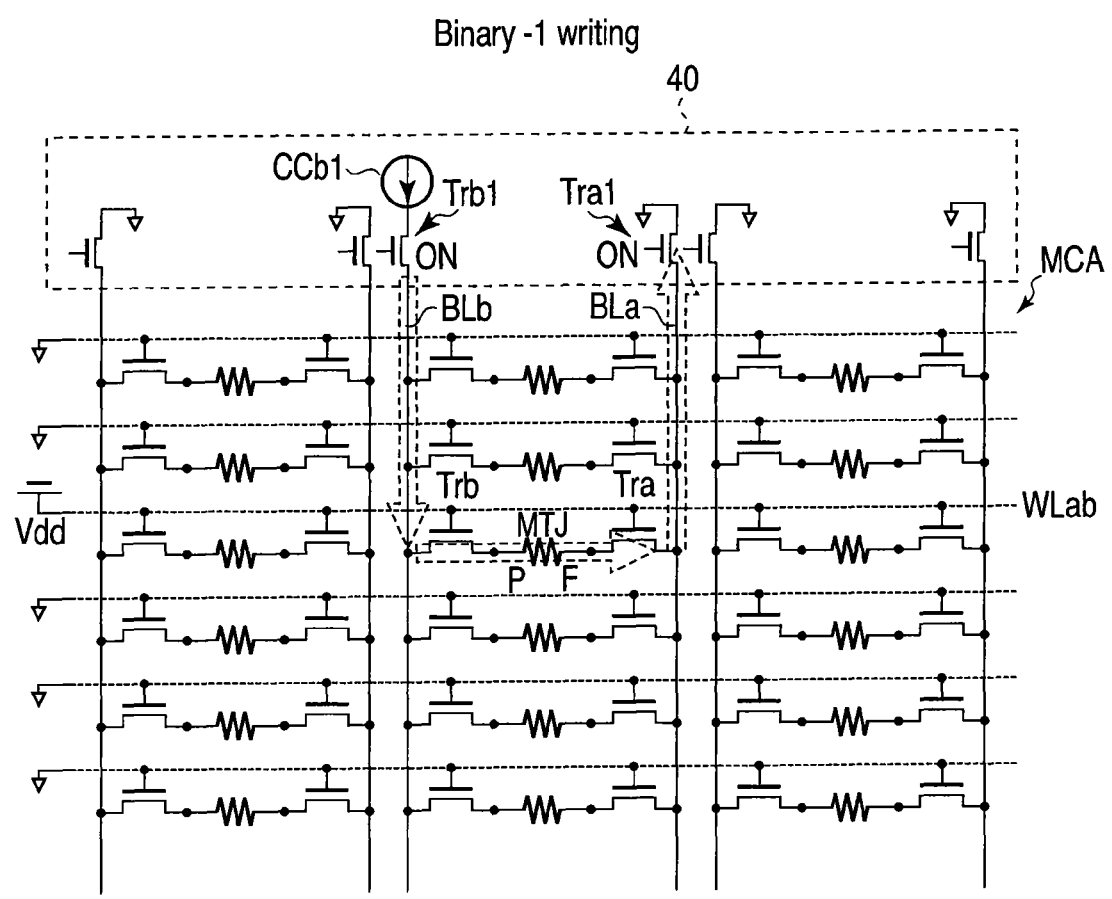
FIG. 7 is a view for illustrating a binary-1 write operation in Example 2 of FIG. 6.
Figure 8:
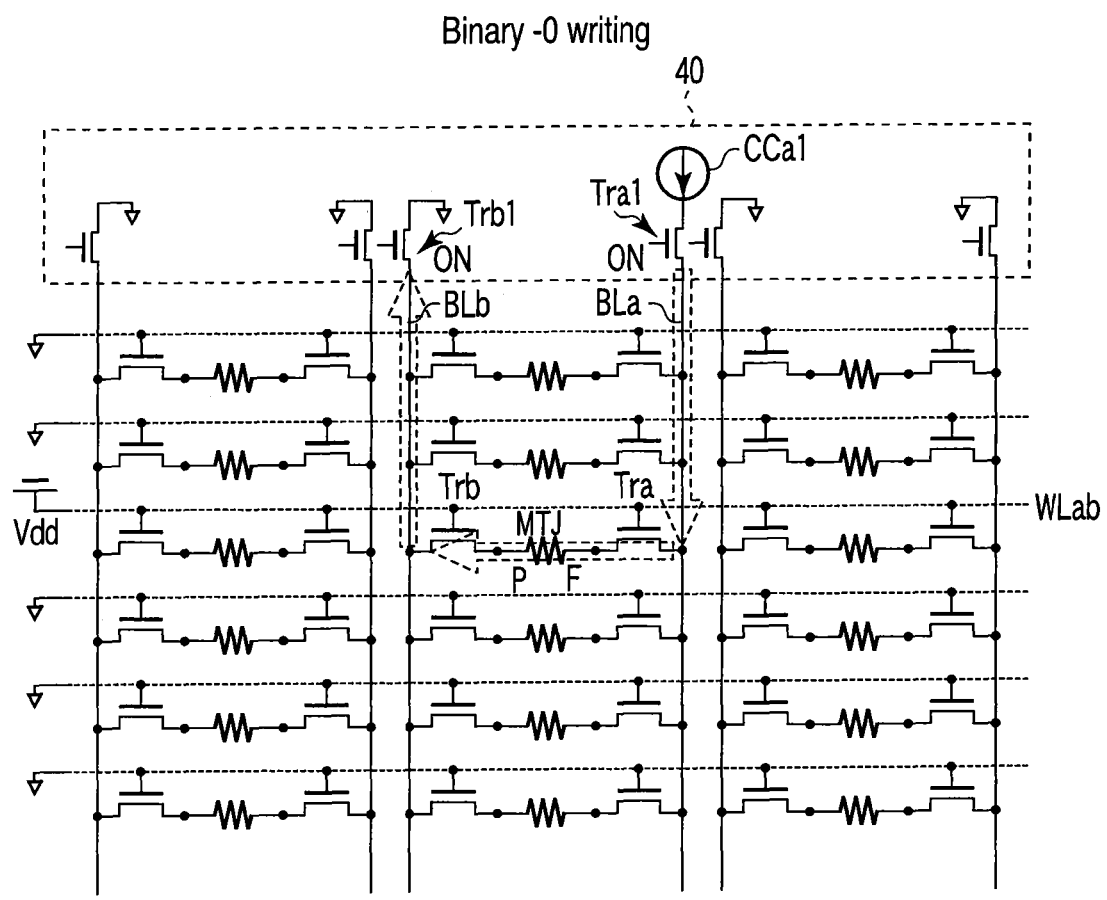
FIG. 8 is a view for illustrating a binary-0 write operation in Example 2 of FIG. 6.

FIG. 6 is a schematic diagram for implementing Example 2 of the write operation of the magnetic random access memory according to one embodiment of the invention. FIGS. 7 and 8 are views for illustrating a binary-1 and binary-0 write operation in Example 2 of FIG. 6. Hereinbelow, Example 2 of the write operation will be described.

As shown in FIG. 6, in Example 2 of the write operation, a driver/sinker 40 is arranged only on the side of one end portion of the memory cell array MCA. Accordingly, one ends of bit lines BL are connected to the driver/sinker 40, and the other ends of bit lines BL are not connected to the driver/sinker.

With such a configuration of peripheral circuits, in Example 2 of the write operation, the write current I is configured to only flow from one end portion (upper side of the drawing) to one end portion (upper side of the drawing) of the memory cell array MCA.

When binary-1 writing is performed, as shown in FIG. 7, the transistors (transfer gate transistors) Tra1 and Trb1, which are connected to bit lines BLa and BLb connected to the selected cell, are turned on. Further, word line WLab is set to the power supply potential Vdd, and transistors Tra and Trb connected to both ends of MTJ element MTJ of the selected cell are turned on. Thus, the write current I is passed from constant current source CCb1 to the selected cell. This write current I flows from the driver/sinker 40, bit line BLb and the fixed layer P of MTJ element MTJ to the recording layer F of MTJ element MTJ, bit line BLa and the driver/sinker 40. That is, the write current I flows from one end portion (upper side of the drawing) to one end portion (upper side of the drawing) of the memory cell array MCA.

When binary-0 writing is performed, as shown in FIG. 8, transistors Tra1 and Trb1, which are connected to bit lines BLa and BLb connected to the selected cell, are turned on. Further, word line WLab is set to the power supply potential Vdd to turn on transistors Tra and Trb connected to both ends of MTJ element MTJ of the selected cell. Thus, the write current I is passed from constant current source CCa1 to the selected cell. This write current I flows from the driver/sinker 40, bit line BLa and the recording layer F of MTJ element MTJ to the fixed layer P of MTJ element MTJ, bit line BLb and the driver/sinker 40. That is, the write current I flows from one end portion (upper side of the drawing) to one end portion (upper side of the drawing) of the memory cell array MCA.

As described above, in Example 2, the driver/sinker 40 of the write circuit is arranged in one end portion of the memory cell array MCA. This allows peripheral circuits to be gathered in one end of the memory cell array MCA. For example, if two memory cell arrays are arranged in a mirror symmetry with respect to a peripheral circuit portion, the circuit can be shared. This sharing will improve area efficiency.

[4-3] Example 3

Figure 10:
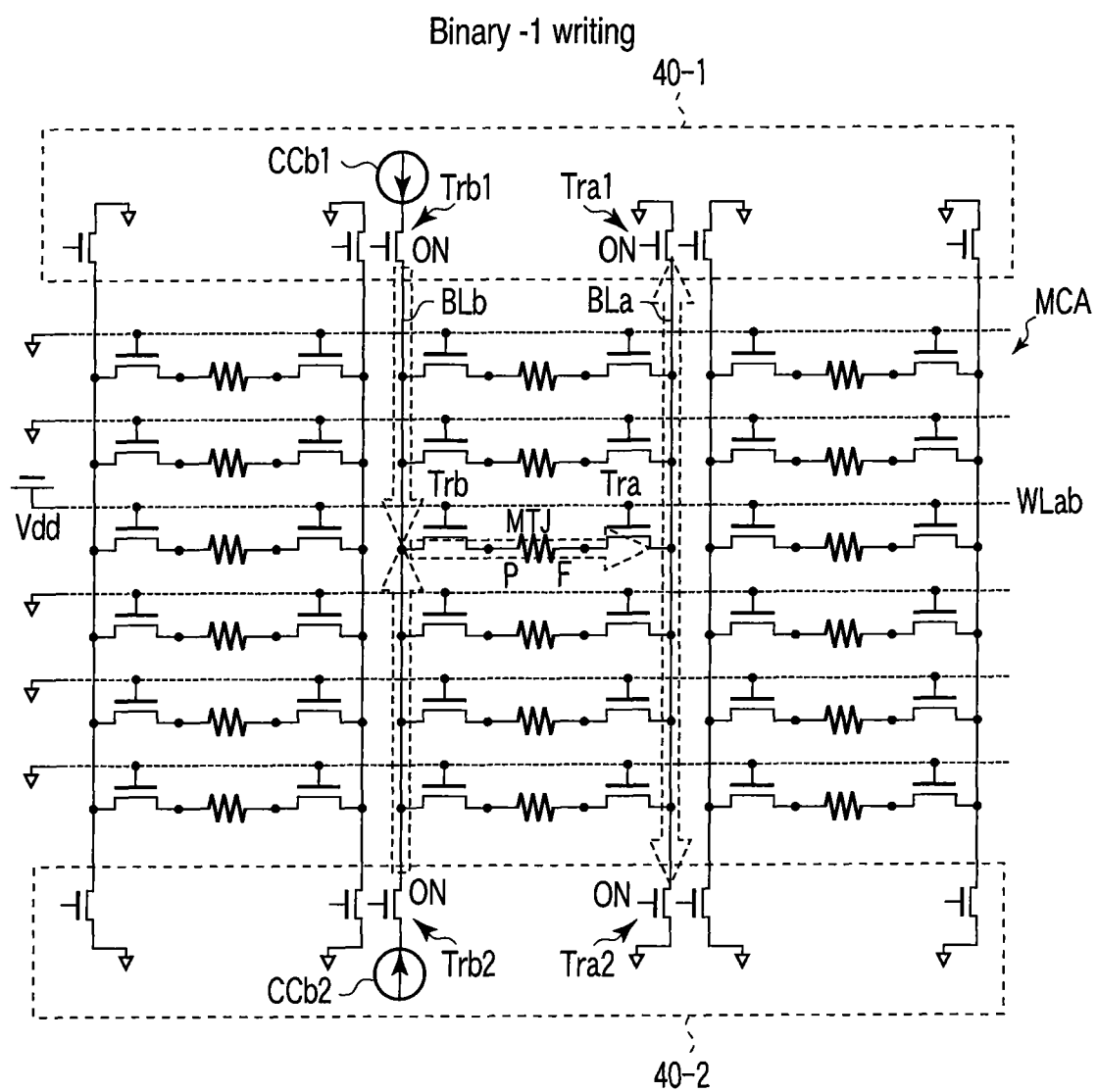
FIG. 10 is a view for illustrating a binary-1 write operation in Example 3 of FIG. 9.

FIG. 9 is a schematic diagram for implementing Example 3 of write operation of the magnetic random access memory according to one embodiment of the invention. FIGS. 10 and 11 are views for illustrating a binary-1 and binary-0 write operation in Example 3 of FIG. 9. FIG. 12 is a view for explaining the resistance of a current path in Example 3 of FIG. 9. Hereinbelow, Example 3 of write operation will be described.

As shown in FIG. 9, in Example 3 of write operation, a driver/sinker 40-1 is arranged only on the first end portion side of the memory cell array MCA, and a driver/sinker 40-2 is arranged only on the second end portion side of the memory cell array MCA. Accordingly, one ends of bit lines BL are connected to the driver/sinker 40-1, and the other ends of bit lines BL are connected to the driver/sinker 40-2.

With such a configuration of peripheral circuits, in Example 3 of write operation, the write current I is configured to flow from the first and second end portions (upper and lower sides of the drawing) to the first and second end portions (upper and lower sides of the drawing) of the memory cell array MCA.

When binary-1 writing is performed, as shown in FIG. 10, four transistors (transfer gate transistors) Tra1, Tra2, Trb1 and Trb2, which are connected to bit lines BLa and BLb connected to the selected cell, are turned on. Further, word line WLab is set to the power supply potential Vdd to turn on transistors Tra and Trb connected to both ends of MTJ element MTJ of the selected cell. Thus, the write currents I are passed from constant current source CCb1 and a constant current source CCb2 to the selected cell. The write currents I flow from the driver/sinkers 40-1 and 40-2, bit line BLb and the fixed layer P of MTJ element MTJ to the recording layer F of MTJ element MTJ, bit line BLa and the driver/sinkers 40-1 and 40-2. That is, the write currents I flow from both ends (upper and lower sides of the drawing) to both ends (upper and lower sides of the drawing) of the memory cell array MCA.

When binary-0 writing is performed, as shown in FIG. 11, the four transistors (transfer gate transistors) Tra1, Tra2, Trb1 and Trb2, which are connected to bit lines BLa and BLb connected to the selected cell, are turned on. Further, word line WLab is set to the power supply potential Vdd to turn on transistors Tra and Trb connected to both ends of MTJ element MTJ of the selected cell. Thus, the write currents I are passed from constant current source CCa1 and a constant current source CCa2 to the selected cell. The write currents I flow from the driver/sinkers 40-1 and 40-2, bit line BLa and the recording layer F of MTJ element MTJ to the fixed layer P of MTJ element MTJ, bit line BLb and the driver/sinkers 40-1 and 40-2. That is, the write currents I flow from both ends (upper and lower sides of the drawing) to both ends (upper and lower sides of the drawing) of the memory cell array MCA.

As described above, in Example 3, the driver/sinkers 40-1 and 40-2 of the write circuit are arranged on both ends of the memory cell array MCA. Here, the resistance of the current path through which the write current I flows is discussed. Example 3 has parallel connection as shown in FIG. 12, and therefore the resistance is, for example, 4R/3. Accordingly, the interconnect resistance can be reduced in Example 3 as compared to those in Example 1 (resistance=2R) and Example 2 (resistance=4R).

Note that while word line WL is a common line for the purpose of concurrently turning on/off switches on both ends of the memory cell in the foregoing Examples 1 to 3, this line may be provided individually for each of the switches on both ends of the memory cell.

In the foregoing Examples 1 to 3, a decoder circuit which can control turning on/off of the transistors (transfer gate transistors) Tra1, Tra2, Trb1 and Trb2 in the case of binary-1 writing and in the case of binary-0 writing is provided.

[5] Read Operation

In read operation of the magnetic random access memory according to one embodiment of the invention, the magnetoresistive effect is utilized.

In the case where data reading of a selected cell of FIG. 1 is performed, for example, the data reading is as follows. Bit line BLa is set to the power supply potential Vdd, and bit lines BL other than bit line BLa are set to the ground potential Vss. Word lines WLa and WLb are set to the power supply potential Vdd, and word lines WL other than word lines WLa and WLb are set to the ground potential Vss. Thus, both transistors Tra and Trb connected to MTJ element MTJ of the selected cell are turned on. As a result, a read current I flows from bit line BLa through MTJ element MTJ to the bit line BLb. According to the resistance of the MTJ element MTJ read on the basis of the read current I, determination of binary 1 or binary 0 is made.

Note that during read operation, a current value may be read by applying a constant voltage between cell array terminals, and a voltage value may also be read by applying a constant current between them.

[6] Layout and Cross-section Structure

[6-1] Example 1

Example 1 is an example of a word line sharing type in which a word line to control switches on both ends of the MTJ element is shared.

FIG. 13 is a schematic circuit diagram of Example 1 of the magnetic random access memory according to one embodiment of the invention. Hereinbelow, the circuit configuration of Example 1 will be schematically described.

As shown in FIG. 13, in a memory cell MC of Example 1, one ends of current paths of transistors Tr1 and Tr2 are connected to both ends of an MTJ element MTJ1. The other end of the current path of transistor Tr1 is connected to bit line BL1, and the other end of the current path of transistor Tr2 is connected to bit line BL2. Gates of transistors Tr1 and Tr2 are connected to a common word line WL1, allowing concurrent control of turning on/off of the transistors Tr1 and Tr2.

A memory cell MCx is adjacent in X-direction to the memory cell MC. Memory cell MCx shares the use of the word line WL1 with the memory cell MC. However, the memory cell MCx uses bit lines BL3 and BL4 which are different from bit lines used by the memory cell MC.

A memory cell MCy is adjacent in Y-direction to memory cell MC. Memory cell MCy uses a word line WL2 which is different from the word line used by memory cell MC. However, memory cell MCy shares the use of the bit lines BL1 and BL2 with memory cell MC.

FIG. 14 schematically shows the layout of Example 1 of a memory cell array of the magnetic random access memory according to one embodiment of the invention. FIG. 15 shows a partial layout of FIG. 14. Hereinbelow, the layout of Example 1 will be described.

Figure 16A:
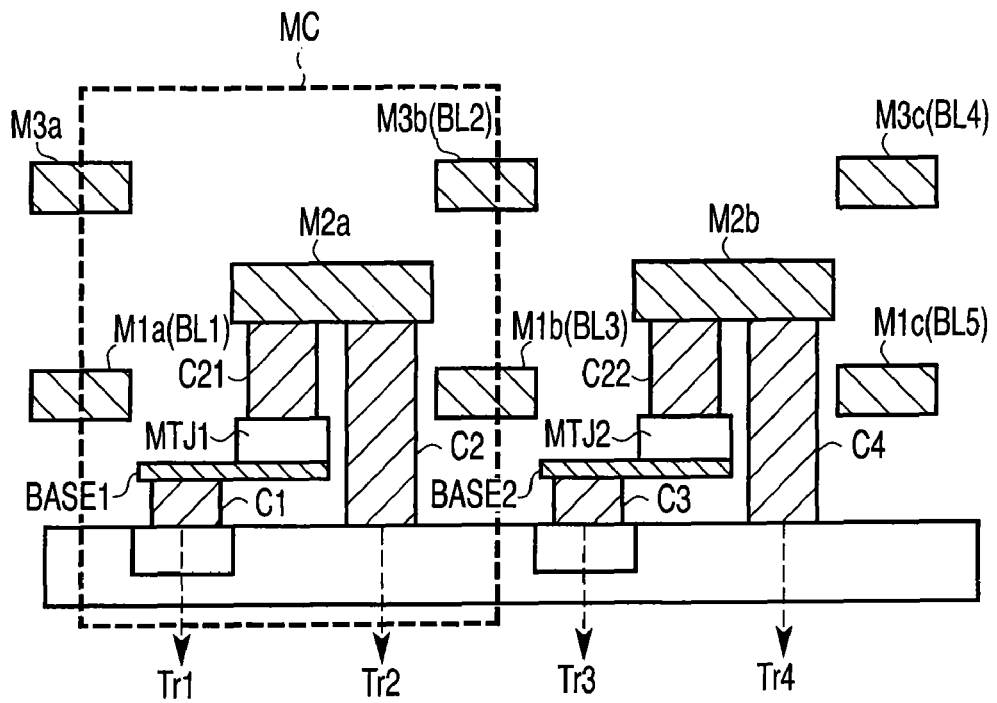
FIG. 16A is a cross-sectional view taken along line XVIA-XVIA of FIG. 14.

As shown in FIG. 14, bit lines BL1 to BL5 and word lines WL1 to WL3 are arranged to cross each other. Here, bit lines BL1, BL3 and BL5 are made of first metal layers M1a, M1b and M1c, and bit lines BL2 and BL4 are made of third metal layers M3b and M3c. Note that as shown in FIG. 16A, metal layer M1a and a metal layer M3a are arranged in the same position at different metal layer levels, metal layers M1b and M3b are arranged in the same position at different metal layer levels, and metal layers M1c and M3c are arranged in the same position at different metal layer levels. In FIG. 14, however, each pair of metal layers is shown such that metal layers are shifted from each other, for the sake of convenience.

In memory cell MC, MTJ element MTJ1 is arranged between bit lines BL1 and BL2, and contacts C1 and C2 are arranged on both sides of MTJ element MTJ1. Word line WL1 is arranged in the vicinity of contacts C1 and C2. Contacts C5 and C6 are arranged to face contacts C1 and C2 across word line WL1.

One end of MTJ element MTJ1 is connected to contact C1, and contact C1 is connected to one end of the source/drain of transistor Tr1. The other end of the source/drain of transistor Tr1 is connected to bit line BL1 via contact C5. As shown in FIG. 15, bit line BL1 is provided with a projection P1 that projects on the contact C5 side (MTJ element MTJ1 side). Bit line BL1 and contact C5 are connected by connecting projection P1 and contact C5.

The other end of MTJ element MTJ1 is connected to contact C2 via a metal layer M2a, and contact C2 is connected to one end of the source/drain of transistor Tr2. The other end of the source/drain of transistor Tr2 is connected to bit line BL2 via contact C6. As shown in FIG. 15, bit line BL2 is provided with a projection P2 that projects on contact C6 side (MTJ element MTJ1 side). Bit line BL2 and contact C6 are connected by connecting projection P2 and contact C6.

Figure 16B:
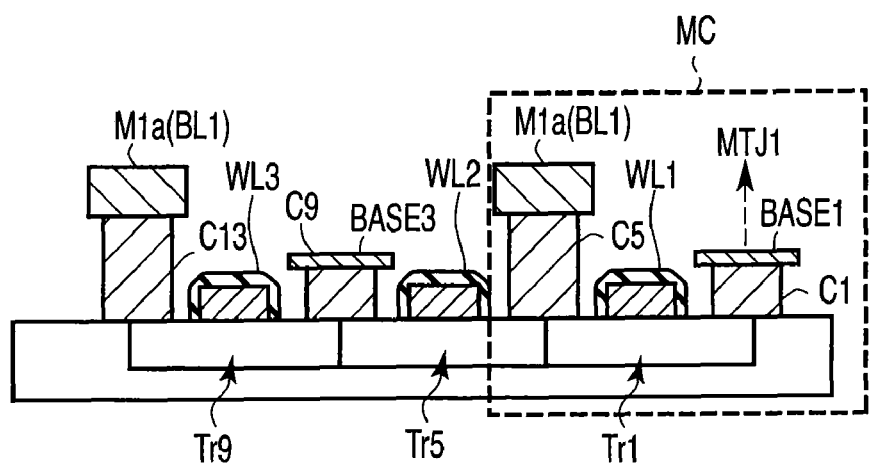
FIG. 16B is a cross-sectional view taken along line XVIB-XVIB of FIG. 14.

FIG. 16A is a cross-sectional view taken along line XVIA-XVIA of FIG. 14. FIG. 16B is a cross-sectional view taken along line XVIB-XVIB of FIG. 14. FIG. 16C is a cross-sectional view taken along line XVIC-XVIC of FIG. 14. Hereinbelow, the cross-sectional structure of Example 1 will be described.

As shown in FIG. 16A, in memory cell MC, the bottom surface of MTJ element MTJ1 is connected to the transistor Tr1 via base metal layer BASE1 and contact C1, and the top surface of the MTJ element MTJ1 is connected to transistor Tr2 via a contact C21, metal layer (second metal layer) M2a and contact C2.

Bit line BL1 connected to transistor Tr1 and bit line BL2 connected to transistor Tr2 are arranged at different interconnect levels (first metal layer and the third metal layer). Arranged under bit line BL2 is bit line BL3 at the first metal layer in the adjacent cells, and bit lines BL2 and BL3 of the adjacent cells are arranged so as to be in the same position at different metal layer levels.

As shown in FIG. 16B, in memory cell MC, one end of the source/drain of transistor Tr1 is connected to MTJ element MTJ1 via contact C1 and base metal layer BASE1, and the other end of the source/drain of the transistor Tr1 is connected to bit line BL1 via contact C5. The gate of transistor Tr1 is connected to word line WL1.

Transistor Tr5 of the cell adjacent to memory cell MC shares a source/drain diffusion layer with transistor Tr1 of memory cell MC. Therefore, transistor Tr5 is connected to bit line BL1 by the use of contact C5 which is shared by transistors Tr1 and Tr5.

As shown in FIG. 16C, in memory cell MC, one end of the source/drain of transistor Tr2 is connected to MTJ element MTJ1 via contact C2 and metal layer M2a, and the other end of the source/drain of transistor Tr2 is connected to bit line BL2 via contact C6. The gate of transistor Tr2 is connected to word line WL1. As such, the gates of transistor Tr1 and transistor Tr2 are connected to the common word line WL1.

According to Example 1 as described above, word lines WL each to control switches on both ends of MTJ element MTJ are common lines, and bit lines BL are placed one over another in a level manner in between adjacent cells. The area of the memory cell can therefore be reduced.

[6-2] Example 2

Example 2 has a circuit configuration which decreases the cell size in a different way from that in Example 1, and is an example of a bit-line sharing type in which a single bit line is shared among cells adjacent in an oblique direction.

Figure 17:
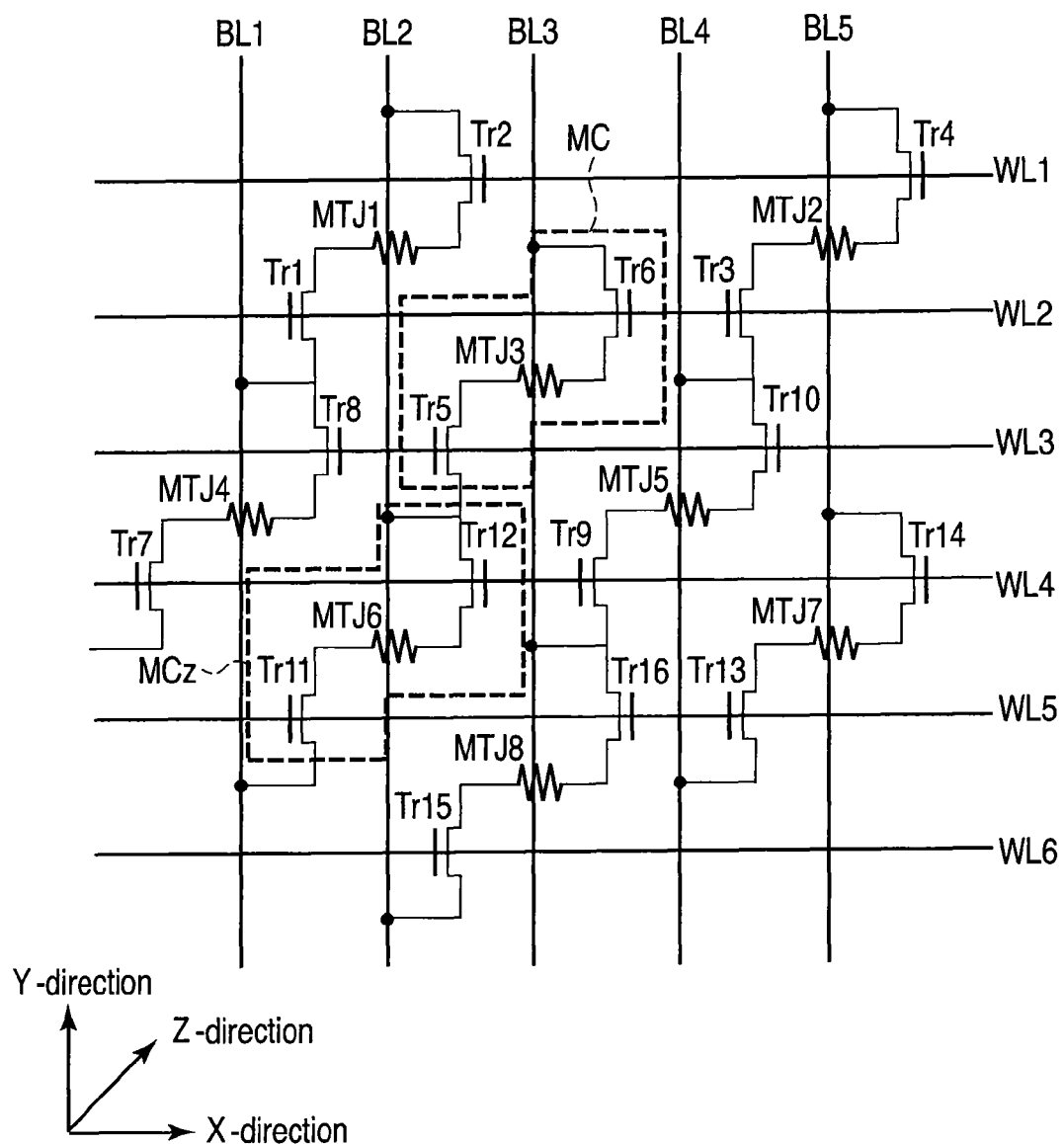
FIG. 17 is a schematic circuit diagram of Example 2 of the magnetic random access memory according to one embodiment of the invention.

FIG. 17 is a schematic circuit diagram of Example 2 of the magnetic random access memory according to one embodiment of the invention. Hereinbelow, the circuit configuration of Example 2 will be schematically described.

As shown in FIG. 17, in memory cell MC of Example 2, one ends of the current paths of transistor Tr5 and a transistor Tr6 are connected to both ends of MTJ element MTJ3. The other end of the current path of transistor Tr5 is connected to bit line BL2, and the other end of the current path of the transistor Tr6 is connected to bit line BL3. The gates of transistors Tr5 and Tr6 are connected to word lines WL3 and WL2, respectively.

In a memory cell MCz adjacent in an oblique direction (Z-direction) to the memory cell MC, one ends of the current paths of transistors Tr11 and Tr12 are connected to both ends of MTJ element MTJ6. The other end of the current path of transistor Tr11 is connected to bit line BL1, and the other end of the current path of transistor Tr12 is connected to bit line BL2. As such, memory cell MC and memory cell MCz adjacent to each other share the single bit line BL2.

Figure 18:
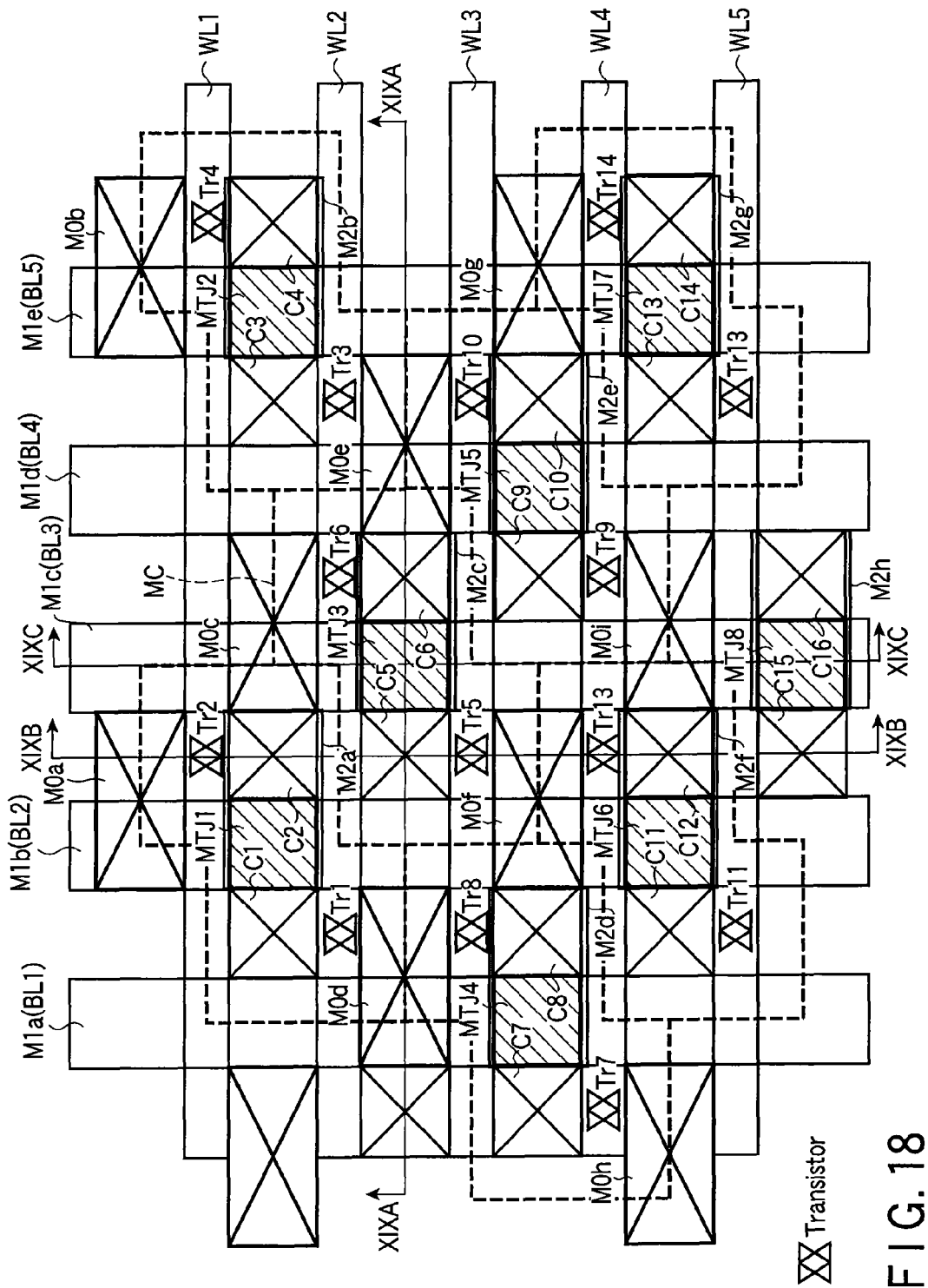
FIG. 18 schematically shows the layout of Example 2 of the memory cell array of the magnetic random access memory according to one embodiment of the invention.

FIG. 18 schematically shows the layout of Example 2 of the memory cell array of the magnetic random access memory according to one embodiment of the invention. Hereinafter, the layout of Example 2 will be described.

As shown in FIG. 18, bit lines BL1 to BL5 and word lines WL1 to WL5 are arranged to cross each other. Here, bit lines BL1 to BL5 are made of the first metal layers M1a, M1b, M1c, M1d and M1e, and arranged at the same interconnect level.

In memory cell MC, MTJ element MTJ3 is arranged above bit line BL3, and contacts C5 and C6 are arranged on both sides of MTJ element MTJ3. Accordingly, contact C5 is positioned between bit lines BL2 and BL3, and contact C6 is positioned between bit lines BL3 and BL4.

Word line WL3 is arranged in the vicinity of contact C5, and a bit line contact M0f is arranged to face contact C5 across word line WL3. Bit line contact M0f extends from between bit lines BL2 and BL3 to bit line BL2 to be connected to bit line BL2.

Word line WL2 is arranged in the vicinity of contact C6, and a bit line contact M0c is arranged to face contact C6 across word line WL2. Bit line contact M0c extends from between bit lines BL3 and BL4 to bit line BL3 to be connected to bit line BL3.

One end of the MTJ element MTJ3 is connected to contact C5, and contact C5 is connected to one end of the source/drain of transistor Tr5. The other end of the source/drain of transistor Tr5 is connected to bit line BL2 via bit line contact M0f.

The other end of MTJ element MTJ3 is connected to contact C6 via metal layer M2c, and contact C6 is connected to one end of the source/drain of transistor Tr6. The other end of the source/drain of transistor Tr6 is connected to bit line BL3 via bit line contact M0c.

Figure 19A:
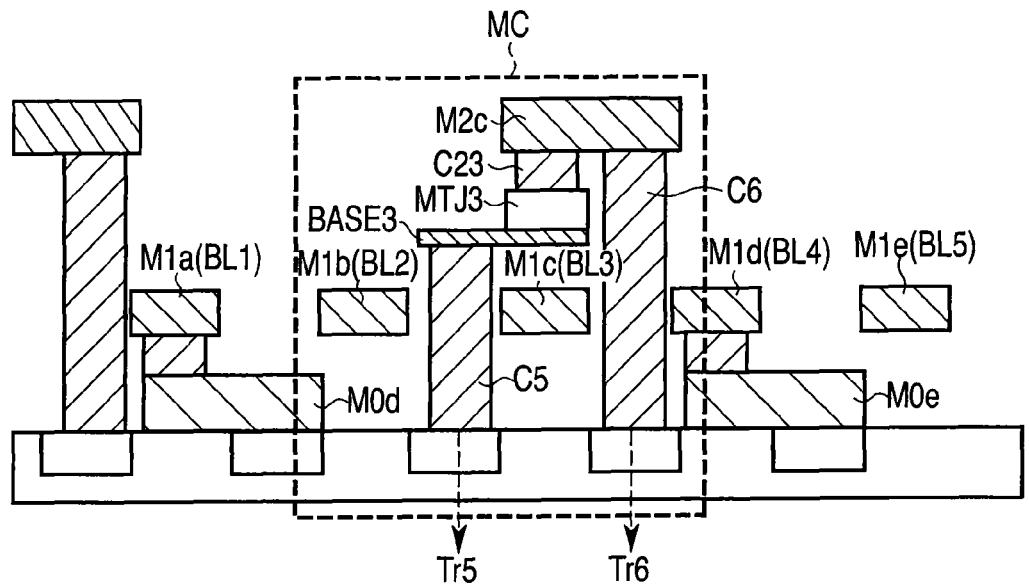
FIG. 19A is a cross-sectional view taken along line XIXA-XIXA of FIG. 18.
Figure 19B:
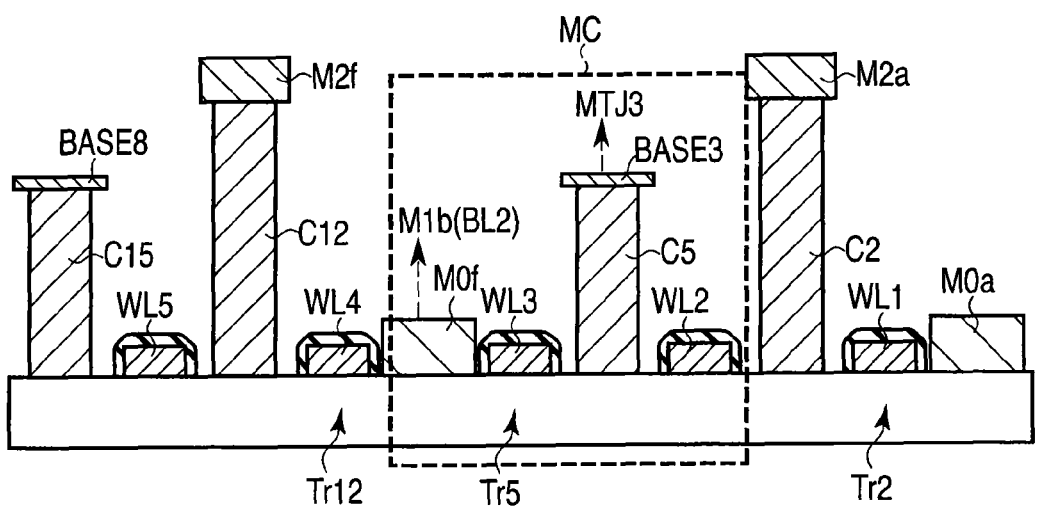
FIG. 19B is a cross-sectional view taken along line XIXB-XIXB of FIG. 18.

FIG. 19A is a cross-sectional view taken along line XIXA-XIXA of FIG. 18. FIG. 19B is a cross-sectional view taken along line XIXB-XIXB of FIG. 18. FIG. 19C is a cross-sectional view taken along line XIXC-XIXC of FIG. 18. Hereinbelow, the cross-sectional structure of Example 2 will be described.

As shown in FIG. 19A, in memory cell MC, the bottom surface of MTJ element MTJ3 is connected to transistor Tr5 via base metal layer BASE3 and contact C5, and the top surface of MTJ element MTJ3 is connected to transistor Tr6 via contact C23, metal layer (second metal layer) M2c and contact C6.

Bit line BL2 connected to transistor Tr5 and bit line BL3 connected to transistor Tr6 are arranged at the same interconnect level (first metal layer).

As shown in FIG. 19B, in memory cell MC, one end of the source/drain of transistor Tr5 is connected to MTJ element MTJ3 via contact C5 and base metal layer BASE3, and the other end of the source/drain of transistor Tr5 is connected to bit line BL2 via bit line contact M0f. The gate of transistor Tr5 is connected to word line WL3.

Transistor Tr12 of the cell adjacent to memory cell MC shares a source/drain diffusion layer with transistor Tr5 of memory cell MC. Therefore, transistor Tr12 is connected to bit line BL2 by the use of bit line contact M0f which is shared by transistors Tr12 and Tr5.

As shown in FIG. 19C, in memory cell MC, the MTJ element MTJ3 is arranged above and between the adjacent word lines WL2 and WL3. Bit line contact M0c is arranged between the adjacent word lines WL1 and WL2, and is connected to the bit line BL3 via contact C24.

According to Example 2 as described above, the switches on both sides of an MTJ element each share a connection contact with the bit line with the switch of a cell adjacent in an oblique direction. A single bit line is shared between cells adjacent in an oblique direction. The area of the memory cell can therefore be reduced.

Note that while an example of forming a bit line below the MTJ element is taken in Example 2, the bit line may be formed above the MTJ element.

[7] Effects

According to one embodiment of the invention, switches are provided on both sides of the MTJ element. Consequently, during reading and writing, turning off switches on both ends of the MTJ element of a non-selected cell which is connected to the activated bit lines enables the non-selected cell to be electrically separated from the two activated bit lines. Accordingly, charging and discharging at the time of reading and writing make it possible to reduce the probability of occurrence of a soft error due to thermal agitation.

Besides, the invention is not limited to the foregoing embodiment. At the implementation stage of the invention, various modifications can be made without departing from the gist of the invention. Further, the foregoing embodiment includes the inventions at various stages, and various inventions can be extracted by appropriately combining the disclosed plural elements. For example, even if some of the elements are omitted from all the elements disclosed in the embodiment, the structures from which these elements are omitted can be extracted as the inventions as long as the object of the invention, which is described in the summary of the invention, and effects, which are described in the effects, can be obtained.

What is claimed is:

1. A magnetic random access memory comprising:
   a first magnetoresistive effect element having a first fixed layer whose magnetization direction is fixed, a first recording layer whose magnetization direction is reversible, and a first non-magnetic layer provided between the first fixed layer and the first recording layer, wherein the magnetization directions of the first fixed layer and the first recording layer are in a parallel state or in an anti-parallel state depending on a direction of a current flowing between the first fixed layer and the first recording layer;
   a first transistor having a first gate and a first current path, the first current path having one end connected to the first fixed layer;
   a second transistor having a second gate and a second current path, the second current path having one end connected to the first recording layer;
   a first bit line to which other end of the first current path is connected; and
   a second bit line to which other end of the second current path is connected,
   wherein when the first magnetoresistive effect element is selected for a write target, the current passes through the first and second current paths; and
   wherein the first and second gates are connected to a common word line.

2. The magnetic random access memory according to claim 1, further comprising:
   a driver arranged only on a side of a first end portion of a memory cell array and connected to one ends of the first and second bit lines; and
   a sinker arranged only on a side of a second end portion of the memory cell array and connected to other ends of the first and second bit lines,
   wherein during write operation, a write current flows from the first end portion to the second end portion of the memory cell array.

3. The magnetic random access memory according to claim 1, further comprising a driver and sinker arranged only on a side of one end portion of a memory cell array and connected to one ends of the first and second bit lines,
   wherein during write operation, a write current flows from the one end portion to the one end portion of the memory cell array.

4. The magnetic random access memory according to claim 1, further comprising:
   a first driver and sinker arranged only on a side of a first end portion of a memory cell array and connected to one ends of the first and second bit lines; and
   a second driver and sinker arranged only on a side of a second end portion of the memory cell array and connected to other ends of the first and second bit lines,
   wherein during write operation, a write current flows from both sides of the first and second end portions to both sides of the first and second end portions of the memory cell array.

5. The magnetic random access memory according to claim 1, wherein the first and second bit lines are arranged on different interconnect layer levels.

6. The magnetic random access memory according to claim 1, wherein
   the first magnetoresistive effect element is arranged between the first and second bit lines,
   the first bit line has a first projection projecting on a side of the first magnetoresistive effect element,
   the second bit line has a second projection projecting on a side of the first magnetoresistive effect element,
   the other end of the first current path is connected to the first projection via a first contact, and
   the other end of the second current path is connected to the second projection via a second contact.

7. The magnetic random access memory according to claim 1, further comprising:
   a second magnetoresistive effect element having a second fixed layer whose magnetization direction is fixed, a second recording layer whose magnetization direction is reversible, and a second non-magnetic layer provided between the second fixed layer and the second recording layer, wherein the magnetization directions of the second fixed layer and the second recording layer are in a parallel state or in an anti-parallel state depending on a direction of a current flowing between the second fixed layer and the second recording layer;
   a third transistor having a third gate and a third current path, the third current path having one end connected to the second fixed layer;
   a fourth transistor having a fourth gate and a fourth current path, the fourth current path having one end connected to the second recording layer;
   a third bit line to which other end of the third current path is connected; and
   a fourth bit line to which other end of the fourth current path is connected, wherein
   the third and fourth gates are connected to the word line, and
   the third bit line is arranged in the same position as a position of the second bit line in a plane surface and at an interconnect layer level different from an interconnect layer level of the second bit line.

8. The magnetic random access memory according to claim 1, wherein the first and second bit lines are arranged at the same interconnect layer level.

9. The magnetic random access memory according to claim 1, further comprising:
   a second magnetoresistive effect element having a second fixed layer whose magnetization direction is fixed, a second recording layer whose magnetization direction is reversible, and a second non-magnetic layer provided between the second fixed layer and the second recording layer, wherein the magnetization directions of the second fixed layer and the second recording layer are in a parallel state or in an anti-parallel state depending on a direction of a current flowing between the second fixed layer and the second recording layer;

a third transistor having a third gate and a third current path, the third current path having one end connected to the second fixed layer;

a fourth transistor having a fourth gate and a fourth current path, the fourth current path having one end connected to the second recording layer;

a first word line connected to the first gate;

a second word line connected to the second gate and adjacent to the first word line;

a third word line connected to the third gate and adjacent to the second word line;

a fourth word line connected to the fourth gate and adjacent to the third word line; and a third bit line to which other end of the third current path is connected, wherein other end of the fourth current path is connected to the first bit line.

10. The magnetic random access memory according to claim 9, wherein the other ends of the first and fourth current paths are connected to the first bit line via a common contact.

11. A magnetic random access memory comprising:

a first magnetoresistive effect element having a first fixed layer, the magnetization direction of which is fixed, a first recording layer, the magnetization direction of which is reversible, and a first non-magnetic layer provided between the first fixed layer and the first recording layer, wherein the magnetization directions of the first fixed layer and the first recording layer are in a parallel state or in an anti-parallel state depending on a direction of a current flowing between the first fixed layer and the first recording layer;

a first transistor having a first gate and a first current path, the first current path having one end connected to the first fixed layer;

a second transistor having a second gate and a second current path, the second current path having one end connected to the first recording layer;

a first bit line to which other end of the first current path is connected; and a second bit line to which other end of the second current path is connected, wherein the first and second gates are connected to a common word line, the first and second bit lines are arranged on different interconnect layer levels, the first magnetoresistive effect element is arranged between the first and second bit lines, the first bit line has a first projection projecting on a first side of the first magnetoresistive effect element, the second bit line has a second projection projecting on a second side of the first magnetoresistive effect element, the other end of the first current path is connected to the first projection via a first contact, and the other end of the second current path is connected to the second projection via a second contact.

12. The magnetic random access memory according to claim 11, further comprising:

a second magnetoresistive effect element having a second fixed layer, the magnetization direction of which is fixed, a second recording layer, the magnetization direction of which is reversible, and a second non-magnetic layer provided between the second fixed layer and the second recording layer, wherein the magnetization directions of the second fixed layer and the second recording layer are in a parallel state or in an anti-parallel state depending on a direction of a current flowing between the second fixed layer and the second recording layer;

a third transistor having a third gate and a third current path, the third current path having one end connected to the second fixed layer;

a fourth transistor having a fourth gate and a fourth current path, the fourth current path having one end connected to the second recording layer;

a third bit line to which other end of the third current path is connected; and a fourth bit line to which other end of the fourth current path is connected, wherein the third and fourth gates are connected to the word line, and the third bit line is arranged in the same position as a position of the second bit line in a plane surface and at an interconnect layer level different from an interconnect layer level of the second bit line.

13. The magnetic random access memory according to claim 11, wherein the first and second projections position opposite to each other.

* * * * *